United States Patent
Arakawa

(10) Patent No.: US 12,319,211 B2
(45) Date of Patent: Jun. 3, 2025

(54) ELECTRONIC CONTROL DEVICE AND METHOD FOR CONTROLLING ELECTRONIC CONTROL DEVICE

(71) Applicant: Hitachi Astemo, Ltd., Hitachinaka (JP)

(72) Inventor: Kei Arakawa, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 2 days.

(21) Appl. No.: 18/557,623

(22) PCT Filed: Mar. 4, 2022

(86) PCT No.: PCT/JP2022/009523
§ 371 (c)(1),
(2) Date: Oct. 27, 2023

(87) PCT Pub. No.: WO2022/270020
PCT Pub. Date: Dec. 29, 2022

(65) Prior Publication Data
US 2024/0217462 A1  Jul. 4, 2024

(30) Foreign Application Priority Data
Jun. 23, 2021 (JP) .................. 2021-103926

(51) Int. Cl.
*B60R 16/03* (2006.01)
*H02J 7/00* (2006.01)

(52) U.S. Cl.
CPC ............ *B60R 16/03* (2013.01); *H02J 7/0034* (2013.01); *H02J 7/0063* (2013.01)

(58) Field of Classification Search
CPC ........ B60R 16/03; H02J 7/0034; H02J 7/0063
(Continued)

(56) References Cited

U.S. PATENT DOCUMENTS

| | | | |
|---|---|---|---|
| 8,624,567 B2 * | 1/2014 | Popescu | H02M 3/1584 323/283 |
| 2018/0212419 A1 | 7/2018 | Yamashita et al. | |
| 2022/0230794 A1 | 7/2022 | Shima et al. | |

FOREIGN PATENT DOCUMENTS

| | | |
|---|---|---|
| WO | WO 2017/057682 A1 | 4/2017 |
| WO | WO 2018/079127 A1 | 5/2018 |
| WO | WO 2020/241469 A1 | 12/2020 |

OTHER PUBLICATIONS

International Search Report (PCT/ISA/210) issued in PCT Application No. PCT/JP2022/009523 dated Jun. 7, 2022 with English translation (4 pages).

(Continued)

*Primary Examiner* — Michael R. Fin
(74) *Attorney, Agent, or Firm* — Crowell & Moring LLP

(57) ABSTRACT

A highly reliable electronic control device capable of preventing a reverse current at the time of GND disconnection in advance without requiring an additional circuit for reverse current detection is provided as an electronic control device in which a plurality of inductive loads are connected in parallel. There are provided a first high-side switch element that allows conduction between a battery power supply and a first external load; a first low-side switch element that allows conduction between a ground and the first external load; a second high-side switch element that allows conduction between the battery power supply and a second external load; and a second low-side switch element that is connected to the common ground with the first low-side switch element, and allows conduction between the ground and the second external load, synchronous rectification control for ON/OFF-controlling the first high-side switch element and the first low-side switch element is performed during a period in which a target current to the first external load is greater than a predetermined threshold value, and reflux (Continued)

control for ON/OFF-controlling the first high-side switch element while the first low-side switch element is turned off is performed during a period in which the target current to the first external load is equal to or less than the predetermined threshold value.

12 Claims, 6 Drawing Sheets

(58) Field of Classification Search
USPC .......................................................... 307/9.1
See application file for complete search history.

(56) References Cited

OTHER PUBLICATIONS

Japanese-language Written Opinion (PCT/ISA/237) issued in PCT Application No. PCT/JP2022/009523 dated Jun. 7, 2022 with English translation (5 pages).

* cited by examiner

ELECTRONIC CONTROL DEVICE AND METHOD FOR CONTROLLING ELECTRONIC CONTROL DEVICE

TECHNICAL FIELD

The present invention relates to a configuration of an electronic control device that drives and controls a load and a control method thereof, and particularly relates to a technique that is effective when applied to an in-vehicle electronic control device that requires high reliability.

BACKGROUND ART

A current control device for a solenoid valve used in an automatic transmission for a vehicle or the like controls a current value flowing through the solenoid valve by adjusting ON/OFF timings of a switch element that controls energization to the solenoid valve by duty control of a PWM signal. In addition, the current value flowing through the solenoid is measured to match the target value, and feedback is applied to the PWM signal to control the current.

In a general automatic transmission for a vehicle, a plurality of solenoid valves are connected, an inductive load thereof is driven and controlled by a single controller, and a vehicle side is a common wiring for the purpose of reducing the sizes of the connector terminal and the vehicle harness and reducing the overall size.

As background art of the present technical field, for example, there is a technique such as PTL 1. PTL 1 discloses "Control device for measuring time for reverse current generated at time of ground disconnection and turning off low-side switch element".

CITATION LIST

Patent Literature

PTL 1: WO 2020/241469 A

SUMMARY OF INVENTION

Technical Problem

In the configuration in which the plurality of inductive loads are connected to one inductive load drive device and the vehicle side of the inductive load drive device is connected by the common wiring as described above, when the ground line of the inductive load drive device is disconnected, a reverse current may be generated from one inductive load to another inductive load.

When such an inductive load drive device is used in, for example, an automatic transmission for a vehicle, a behavior accompanied by a shift shock may occur due to a reverse current.

In PTL 1 described above, an HS/LS control time measurement circuit 20 is added in order to detect the reverse current, and there are problems such as a problem of reliability due to an increase in the number of components and a disadvantage regarding reducing the size and reducing the costs of a device.

Therefore, an object of the present invention is to provide a highly reliable electronic control device capable of preventing a reverse current at the time of GND disconnection in advance without requiring an additional circuit for reverse current detection as an electronic control device in which a plurality of inductive loads are connected in parallel, and a control method thereof.

Solution to Problem

In order to solve the above problems, according to the present invention, there are provided a first high-side switch element that allows conduction between a battery power supply and a first external load; a first low-side switch element that allows conduction between a ground and the first external load; a second high-side switch element that allows conduction between the battery power supply and a second external load; and a second low-side switch element that is connected to the common ground with the first low-side switch element, and allows conduction between the ground and the second external load, synchronous rectification control for ON/OFF-controlling the first high-side switch element and the first low-side switch element is performed during a period in which a target current to the first external load is greater than a predetermined threshold value, and reflux control for ON/OFF-controlling the first high-side switch element while the first low-side switch element is turned off is performed during a period in which the target current to the first external load is equal to or less than the predetermined threshold value.

In addition, according to the present invention, there is provided a method for controlling an electronic control device in which a plurality of external loads are connected in parallel, and a low-side switch element of a first load drive device and a low-side switch element of a second load drive device are connected to a common ground, the method including: performing synchronous rectification control for ON/OFF-controlling a high-side switch element and a low-side switch element of a first load drive device that drives the first external load during a period in which a target current to the first external load is greater than a predetermined threshold value; and performing reflux control for ON/OFF-controlling a high-side switch element of the first load drive device while the low-side switch element of the first load drive device is turned off during a period in which the target current to the first external load is equal to or less than the predetermined threshold value.

Advantageous Effects of Invention

According to the present invention, it is possible to realize a highly reliable electronic control device capable of preventing a reverse current at the time of GND disconnection in advance without requiring an additional circuit for reverse current detection as an electronic control device in which a plurality of inductive loads are connected in parallel, and a control method thereof.

As a result, even at the time of GND disconnection, it is possible to prevent an unintended operation of the inductive load and to continue the current control of the inductive load.

The problems, configurations, and effects other than those described above will be clarified from the description of the embodiments below.

DESCRIPTION OF EMBODIMENTS

Figure 1:
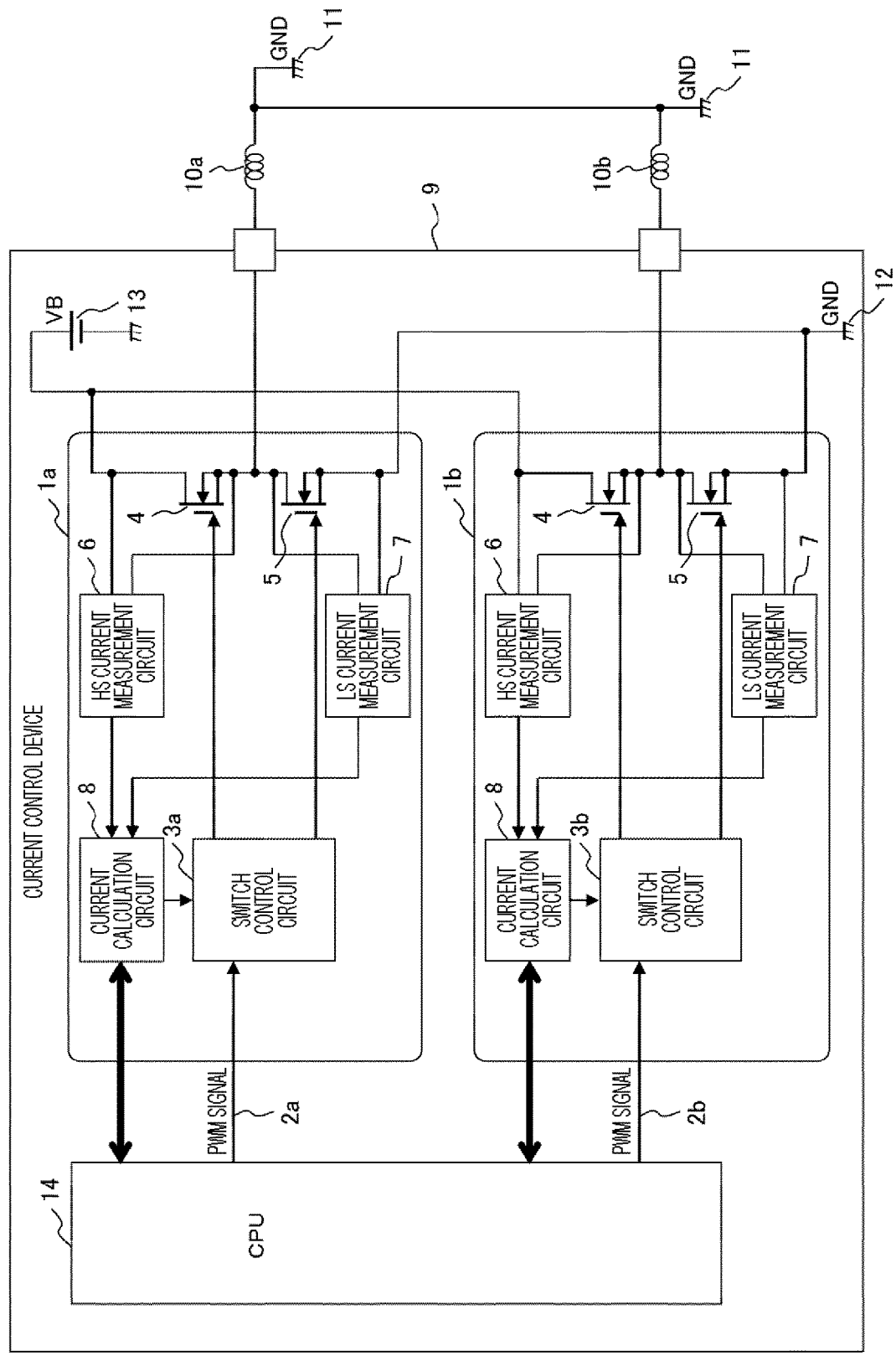
FIG. 1 is a functional block diagram of a current control device according to Example 1 of the present invention.

Hereinafter, examples of the present invention will be described with reference to the drawings. In the drawings, the same components will be given the same reference numerals, and the detailed description of overlapping components will be omitted.

In addition, in the following description, an example of a current control device for an automatic transmission for a vehicle to which a plurality of solenoid valves are connected and which drives and controls the solenoid valves by one central processing unit (CPU) will be described, but the present invention is not limited thereto, and can also be applied to a current control device for other uses (also referred to as an electronic control unit (ECU)).

Example 1

Figure 2:
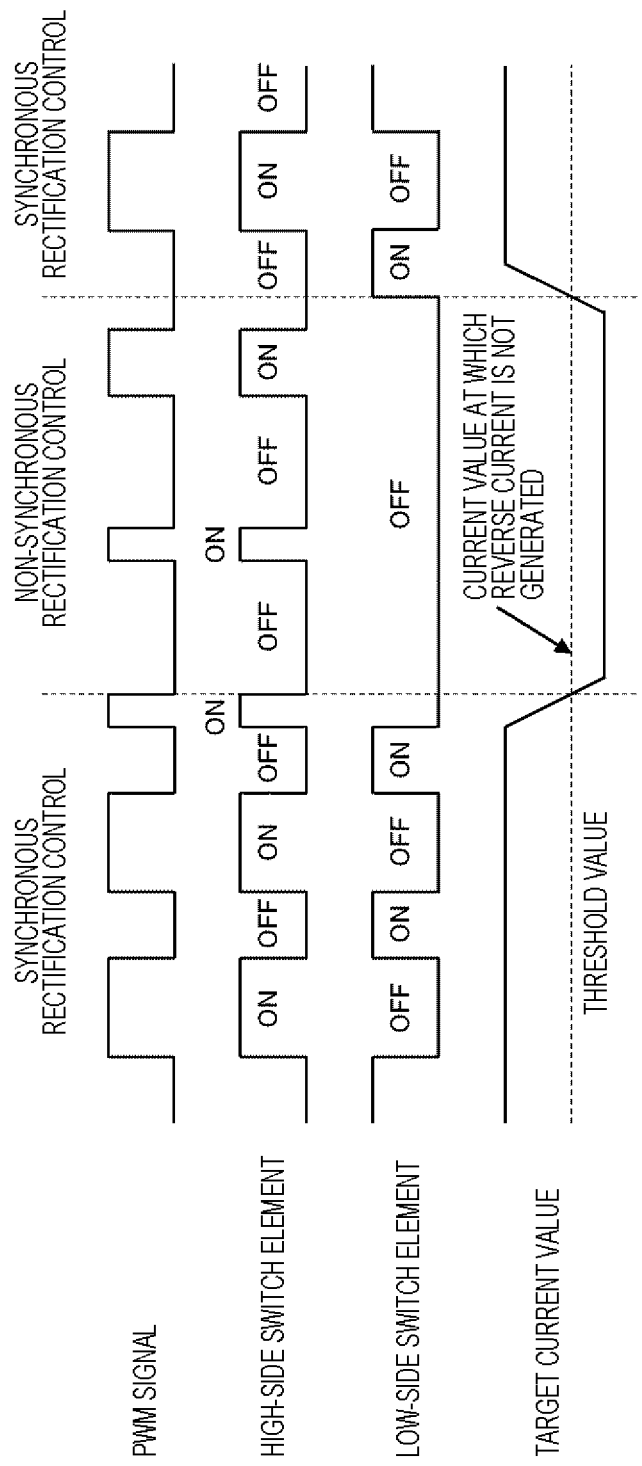
FIG. 2 is a timing chart illustrating a circuit operation of the current control device of FIG. 1.

A current control device and a method of controlling the current control device according to Example 1 of the present invention will be described with reference to FIGS. 1 and 2. FIG. 1 is a functional block diagram of a current control device 9 of the present example. FIG. 2 is a timing chart illustrating a circuit operation of the current control device 9 of FIG. 1.

As illustrated in FIG. 1, the current control device 9 of the present embodiment includes, as main components, a CPU 14 and load drive devices 1a and 1b that supply current to a plurality of solenoid valves 10a and 10b as external loads. Here, for simplification of the drawing, the plurality of solenoid valves and the load drive devices are omitted with there being two sets of each, but the number is not limited.

In both the load drive devices 1a and 1b, one ends of the solenoid valves 10a and 10b that supply current are connected to connection points of a high-side switch element 4 and a low-side switch element 5 connected in series to a battery power supply 13. The other ends of the solenoid valves 10a and 10b are connected to a common solenoid valve ground 11.

The CPU 14 calculates current values to be supplied to the solenoid valves 10a and 10b necessary for the vehicle automatic transmission system, and outputs PWM signals 2a and 2b for synchronous rectification control for ON/OFF-controlling the high-side switch element 4 and the low-side switch element 5 with respect to the load drive devices 1a and 1b using the current values as target currents.

Since the configurations and the operations of the load drive devices 1a and 1b are basically the same, the configuration and the operation of the load drive device 1b that mainly drives the solenoid valve 10b will be described below.

The load drive device 1b that has received the PWM signal 2b from the CPU 14 performs synchronous rectification control to turn on the high-side switch element 4 and turn off the low-side switch element 5 when the PWM signal 2b is at a high level by the switch control circuit 3b, and supplies a current from the battery power supply 13 to the solenoid valve 10b via the high-side switch element 4.

On the other hand, when the PWM signal 2b is at the low level, synchronous rectification control of turning off the high-side switch element 4 and turning on the low-side switch element 5 is performed to cut off the current supply from the battery power supply 13, and the energy accumulated in the solenoid valve 10b is released by refluxing the current from a current control device ground 12 to the solenoid valve 10b via the low-side switch element 5.

The energizing current to the solenoid valve 10b can be increased or decreased by changing the duty ratio of the PWM signal 2b, and the current control to the solenoid valve 10b is realized by performing feedback control such that the duty ratio of the PWM signal 2b corrects the difference between the target current from the CPU 14 and the current value flowing through the solenoid valve 10b.

The current value flowing through the solenoid valve 10b is detected by an HS current measurement circuit 6 and an LS current measurement circuit 7 connected to each of the high-side switch element 4 and the low-side switch element 5. Effectively, based on the current detection result, a current calculation circuit 8 calculates an average current value for a certain period necessary for feedback control, and transfers the average current value to the CPU 14.

When the current flows to the first high-side switch element 4 in the load drive device 1a, the current (reverse current) also flows into the solenoid valve 10b. A difference between the reverse current and the magnitude of the current flowing to the solenoid valve 10b via the second high-side switch element 4 in the load drive device 1b is a current value for driving the solenoid valve 10b.

This current becomes a reverse current flowing to the current control device 9 side in the solenoid valve 10b when the second low-side switch element 5 is ON. This is also the case where the current value supplied to the solenoid valve 10b is small.

At the normal time, the reverse current is canceled by the current flowing to the solenoid valve 10b via the second high-side switch 4 or the reflux current flowing via the second low-side switch element 5. However, for example, when the current control device ground 12, which is a common ground of the load drive device 1a and the load drive device 1b, is disconnected, the reflux current flowing from the current control device ground 12 via the second low-side switch element 5 disappears, and thus the reverse current flows from the solenoid valve 10b into the second low-side switch element 5 when the second low-side switch element 5 is turned on. Therefore, depending on the value of the flowing current, the solenoid valve 10b may perform a valve operation to generate an unintended speed shift shock.

Therefore, in the present example, as illustrated in FIG. 2, during the normal control, the high-side switch element and the low-side switch element perform synchronous rectification control according to the PWM signal during a period in which the target current for driving each of the solenoid valves 10a and 10b is equal to or greater than a predetermined threshold valve, and the switch control circuit 3b turns off the low-side switch element regardless of the PWM signal during a period in which the target current is equal to or less than the predetermined threshold value. At this time, the reflux current flows to the solenoid valve 10b via the parasitic diode of the low-side switch element.

Since the reverse current is generated when the supply current to the solenoid valve 10b is small, the reflux current when the low-side switch element is off is also small, and the heat generation of the low-side switch element 5 can also be suppressed to be small.

As described above, the current control device 9 (electronic control device) according to the present example, includes: the first high-side switch element 4 that allows conduction between the battery power supply 13 and the first external load (solenoid valve 10a); the first low-side switch element 5 that allows conduction between the ground and the first external load (solenoid valve 10a); the second high-side switch element 4 that allows conduction between the battery power supply 13 and the second external load (solenoid valve 10b); and the second low-side switch element 4 that is connected to the common ground (current control device ground 12) with the first low-side switch element 5, and allows conduction between the ground and the second external load (solenoid valve 10b), synchronous rectification control for ON/OFF-controlling the first high-side switch element 4 and the first low-side switch element 5 is performed during a period in which a target current to the first external load (solenoid valve 10a) is greater than a predetermined threshold value, and reflux control for ON/OFF-controlling the first high-side switch element 4 while the first low-side switch element 5 is turned off is performed during a period in which the target current to the first external load (solenoid valve 10a) is equal to or less than the predetermined threshold value.

By switching between the synchronous rectification control and the reflux control based on the threshold value at which the reverse flow occurs at the time of the common GND disconnection, the heat generation of the element is suppressed by the synchronous rectification control when the indicated current (target current) is large, the reverse flow can be suppressed at the time of the disconnection, and accordingly, the fail-over (F/O) using the parasitic diode can be realized.

As a result, it is possible to reduce the size of the harness (reduce the weight of the vehicle) by adopting the common GND at low cost and with size reduction.

In addition, in the current control device 9 (electronic control device) of the present example, when the target current to the first external load (solenoid valve 10a) is equal to or less than a predetermined threshold value, the first high-side switch element 4 and the first low-side switch element 5 are turned off.

When the indicated current (target current) is equal to or less than a predetermined threshold value, it is possible to suppress the reverse current by eliminating the reflux path, and it is possible to prevent an unintended operation of the solenoid valve and to ensure the safety of the vehicle system.

According to the current control device 9 (electronic control device) of the present example, even when the electronic control device ground 12 which is a common ground of the load drive device 1a and the load drive device 1b is disconnected, it is possible to continue the feedback control for the solenoid valve capable of performing the normal feedback control while cutting off the path of the reverse current and suppressing the occurrence of unintended valve operation of the solenoid valve.

It goes without saying that the same effect can be obtained by turning off the low-side switch element 5 when the target value of the current supplied to the solenoid valve is 0, that is, by setting the predetermined threshold value to 0 mA.

In addition, by setting the current to 0 mA, it is possible to eliminate the reflux current flowing to the parasitic diode of the low-side switch element and to suppress heat generation of the low-side switch element.

Example 2

Figure 3:
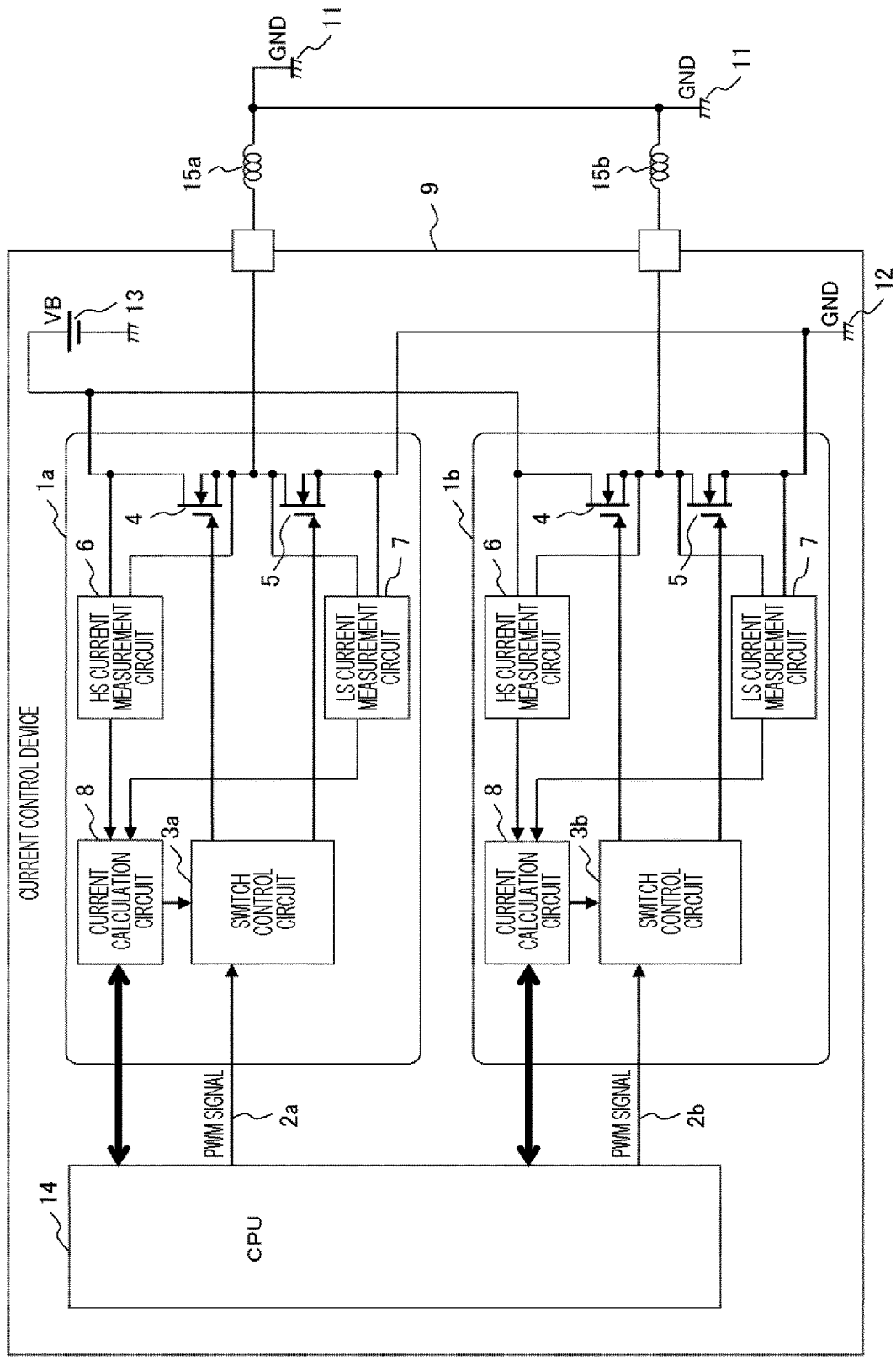
FIG. 3 is a functional block diagram of a current control device according to Example 2 of the present invention.
Figure 4:
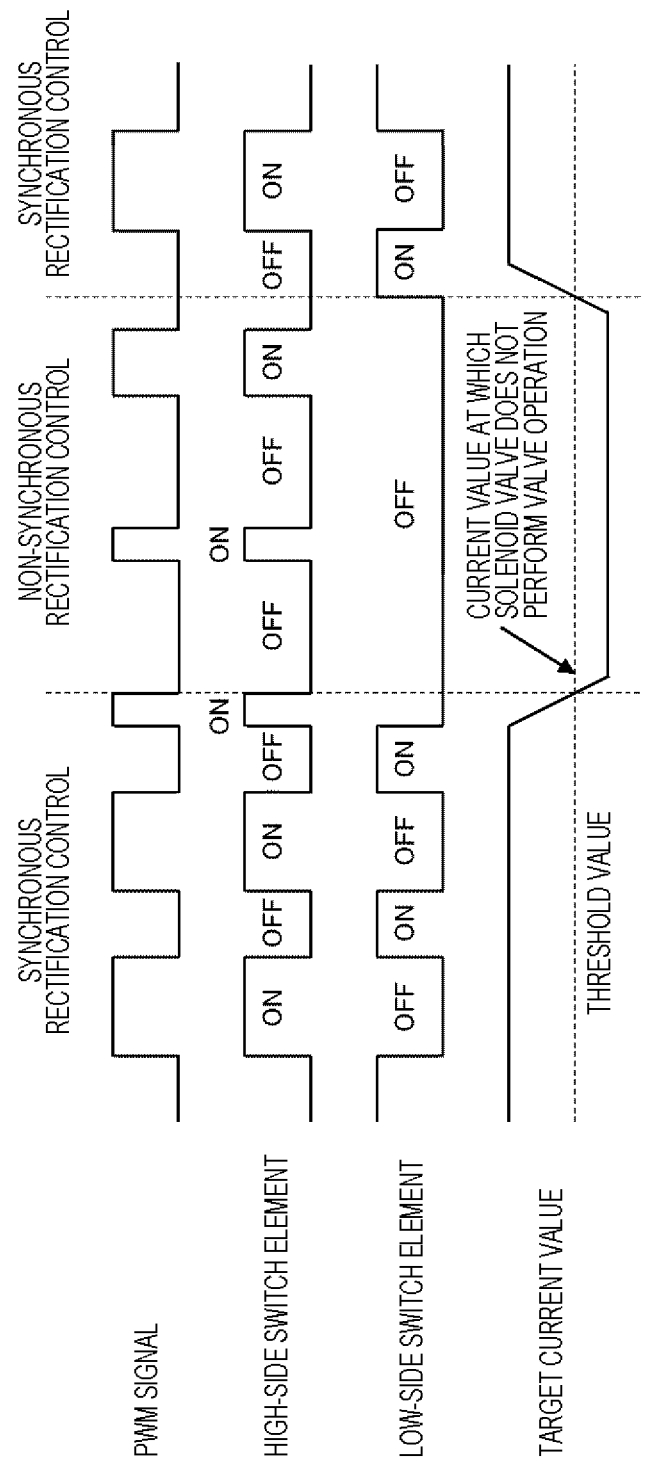
FIG. 4 is a timing chart illustrating the circuit operation of the current control device of FIG. 3.

A current control device and a method of controlling the current control device according to Example 2 of the present invention will be described with reference to FIGS. 3 and 4. FIG. 3 is a functional block diagram of the current control device 9 of the present example. FIG. 4 is a timing chart illustrating a circuit operation of the current control device 9 of FIG. 3.

The configuration of FIG. 3 is basically the same as the configuration of FIG. 1, but the plurality of solenoid valves 15a and 15b to be connected do not perform the valve operation at a low current, and the predetermined threshold value in Example 1 is set to a current value at which the solenoid valves 15a and 15b do not operate.

In the present example, as illustrated in FIG. 4, during the normal control, the high-side switch element and the low-side switch element perform synchronous rectification control according to the PWM signal during a period in which the target current for driving each of the solenoid valves 15a and 15b is equal to or greater than a predetermined threshold valve, and the switch control circuit 3b turns off the low-side switch element regardless of the PWM signal during a period in which the target current is equal to or less than the predetermined threshold value.

Accordingly, even when the electronic control device ground 12 which is a common ground of the load drive device 1a and the load drive device 1b is disconnected, it is possible to continue the feedback control for the solenoid valve capable of performing the normal feedback control while cutting off the path of the reverse current and suppressing the occurrence of unintended valve operation of the solenoid valve.

Example 3

Figure 5:
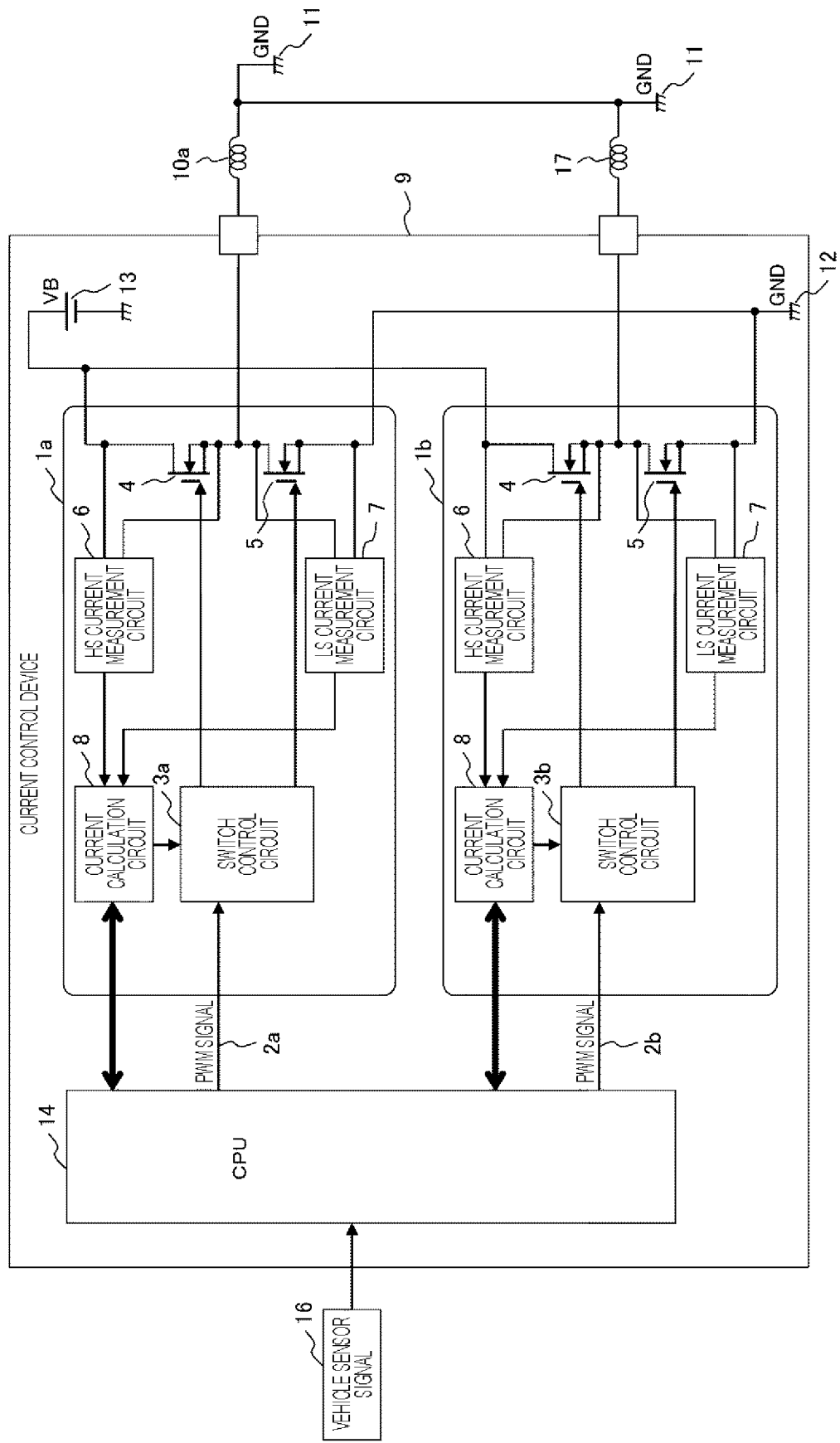
FIG. 5 is a functional block diagram of a current control device according to Example 3 of the present invention.
Figure 6:
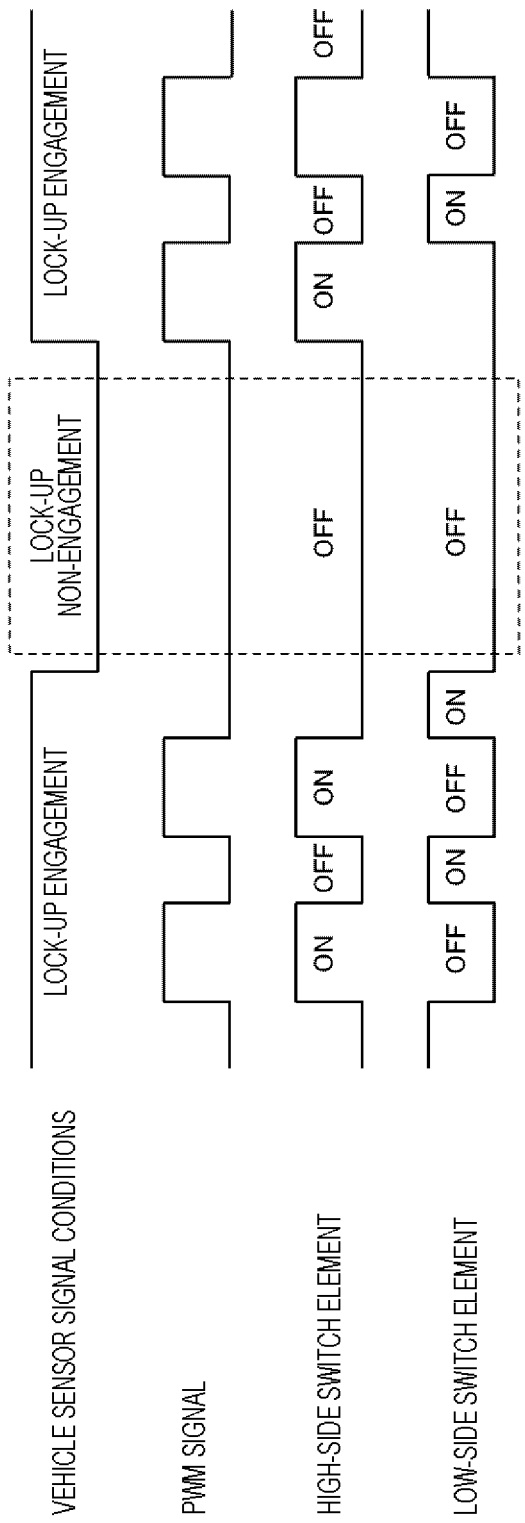
FIG. 6 is a timing chart illustrating the circuit operation of the current control device of FIG. 5.

A current control device and a method of controlling the current control device according to Example 3 of the present invention will be described with reference to FIGS. 5 and 6. FIG. 5 is a functional block diagram of the current control device 9 of the present example. FIG. 6 is a timing chart illustrating a circuit operation of the current control device 9 of FIG. 5.

Solenoid valves controlled by a current control device (electronic control device) for controlling a vehicle automatic transmission include solenoid valves that control opening and closing of a lock-up clutch. The lock-up clutch is a mechanism that mechanically fixes an engine and a vehicle automatic transmission and directly transmits engine torque, and a CPU configured in a current control device receives sensor signals from various sensors such as a throttle sensor and a vehicle speed sensor of a vehicle, and performs opening/closing control of the lock-up clutch in accordance with a vehicle state.

When the lock-up clutch is engaged at an unintended time, there is a possibility that the vehicle is affected by an engine stall or the like. Therefore, it is necessary to perform control to cut off the reverse current at the time of common ground disconnection of the current control device and suppress the solenoid valve operation of the lock-up clutch at an unintended time.

Therefore, in the present example, as illustrated in FIG. 5, a vehicle sensor signal 16 from various sensors, such as a throttle sensor of a vehicle and a vehicle speed sensor, which are input conditions for engaging a lock-up clutch, is added to the configuration of Example 1 (FIG. 1), and the CPU 14 inputs information of the vehicle sensor signal 16 to the switch control circuit 3b, and uses the information for switch control of ON and OFF of the high-side switch element 4 and the low-side switch element 5 to control a lock-up solenoid valve 17.

In the present example, as illustrated in FIG. 6, when the vehicle sensor signal condition requires lock-up engagement, the PWM signal 2b sent from the CPU 14 to the load drive device 1b is transmitted to the switch control circuit 3b as a signal for turning on and off the high-side switch element 4 and the low-side switch element 5 to perform synchronous rectification control.

Meanwhile, when the vehicle sensor signal condition requires lock-up non-engagement, the PWM signal 2b sent from the CPU 14 to the load drive device 1b is transmitted to the switch control circuit 3b as a signal for turning off the high-side switch element and the low-side switch element.

As described above, according to the present example, by turning off the low-side switch element 5 during a period in which it is not necessary to engage the lock-up clutch, that is, during a period in which no current is supplied to the lock-up solenoid valve 17, it is possible to cut off the path of the reverse current at the time of disconnection of the current control device ground 12 which is the common ground of the current control device 9, to suppress the engagement of the lock-up clutch at an unintended timing, and to suppress the occurrence of a state abnormality of the vehicle due to an engine stall or the like.

As described above, in the current control device 9 (electronic control device) of the present example, the first high-side switch element 4 and the first low-side switch element 5 are turned off during the low vehicle speed control that is not subjected to the lock-up control. The vehicle speed at which the lock-up control is not performed is, for example, 0 km/h.

At the time of low vehicle speed control without lock-up control, it is possible to suppress a reverse current by eliminating the reflux path, and it is possible to prevent unintended operation of the solenoid valve and to ensure safety of the vehicle system.

In addition, the present invention is not limited to the above-described examples, and includes various modification examples. For example, the above-described examples are examples which are described in detail in order to make it easy to understand the present invention, and are not limited to a case where all of the described configurations are necessarily provided. In addition, a part of the configuration of a certain example can be replaced with the configuration of other examples, and the configuration of the other example can be added to the configuration of a certain example. Furthermore, it is also possible to add, remove, or substitute other configurations to, from, and for a part of the configuration of each example.

In addition, control lines and signal lines that are considered to be necessary for the description are illustrated, and all the control lines and signal lines in the product are not necessarily illustrated.

REFERENCE SIGNS LIST 1a, 1b load drive device
2a, 2b PWM signal
3a, 3b switch control circuit
4 high-side switch element
5 low-side switch element
6 HS current measurement circuit
7 LS current measurement circuit
8 current calculation circuit
9 current control device
10a, 10b solenoid valve
11 solenoid valve ground (GND)
12 current control device ground (GND)
13 battery power supply
14 CPU
15a, 15b solenoid valve that does not operate at low current
16 vehicle sensor signal
17 lock-up solenoid valve

The invention claimed is:

1. An electronic control device comprising:
   a first high-side switch element that allows conduction between a battery power supply and a first external load;
   a first low-side switch element that allows conduction between a ground and the first external load;
   a second high-side switch element that allows conduction between the battery power supply and a second external load; and
   a second low-side switch element that is connected to the common ground with the first low-side switch element, and allows conduction between the ground and the second external load, wherein
   synchronous rectification control for ON/OFF-controlling the first high-side switch element and the first low-side switch element is performed during a period in which a target current to the first external load is greater than a predetermined threshold value, and reflux control for ON/OFF-controlling the first high-side switch element while the first low-side switch element is turned off is performed during a period in which the target current to the first external load is equal to or less than the predetermined threshold value.

2. The electronic control device according to claim 1, wherein
   the first high-side switch element and the first low-side switch element are turned off when a target current to the first external load is equal to or less than the predetermined threshold value.

3. The electronic control device according to claim 1, wherein
   the target current is 0 A.

4. The electronic control device according to claim 1, wherein
   the first external load and the second external load are solenoid valves, and
   the predetermined threshold value is a current value at which the solenoid valve does not operate.

5. The electronic control device according to claim 1, wherein
   the electronic control device is an in-vehicle electronic control device, and
   the first high-side switch element and the first low-side switch element are turned off at the time of low vehicle speed control in which lock-up control is not performed.

6. The electronic control device according to claim 5, wherein
   a vehicle speed at which the lock-up control is not performed is 0 km/h.

7. A method for controlling an electronic control device in which a plurality of external loads are connected in parallel, and a low-side switch element of a first load drive device and a low-side switch element of a second load drive device are connected to a common ground, the method comprising:
   performing synchronous rectification control for ON/OFF-controlling a high-side switch element and a low-side switch element of a first load drive device that drives the first external load during a period in which a target current to the first external load is greater than a predetermined threshold value; and performing reflux control for ON/OFF-controlling a high-side switch element of the first load drive device while the low-side switch element of the first load drive device is turned off during a period in which the target current to the first external load is equal to or less than the predetermined threshold value.

8. The method for controlling an electronic control device according to claim 7, wherein the high-side switch element and the low-side switch element of the first load drive device are turned off when a target current to the first external load is equal to or less than the predetermined threshold value.

9. The method for controlling an electronic control device according to claim 7, wherein the target current is 0 A.

10. The method for controlling an electronic control device according to claim 7, wherein the plurality of external loads are solenoid valves, and the predetermined threshold value is a current value at which the solenoid valve does not operate.

11. The method for controlling an electronic control device according to claim 7, wherein the electronic control device is an in-vehicle electronic control device, and the high-side switch element and the low-side switch element of the first load drive device are turned off at the time of low vehicle speed control in which lock-up control is not performed.

12. The method for controlling an electronic control device according to claim 11, wherein a vehicle speed at which the lock-up control is not performed is 0 km/h.

* * * * *